(12) United States Patent
Minami

(10) Patent No.: US 10,205,031 B2
(45) Date of Patent: Feb. 12, 2019

(54) SEMICONDUCTOR DEVICE HAVING RESISTANCE VOLTAGE DIVIDING CIRCUIT

(71) Applicant: ABLIC Inc., Chiba-shi, Chiba (JP)

(72) Inventor: Yukimasa Minami, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/936,556

(22) Filed: Mar. 27, 2018

(65) Prior Publication Data

US 2018/0286990 A1 Oct. 4, 2018

(30) Foreign Application Priority Data

Mar. 30, 2017 (JP) ................ 2017-068173

(51) Int. Cl.
| | | |
|---|---|---|
| *H01L 29/86* | (2006.01) | |
| *H01L 29/8605* | (2006.01) | |
| *H01L 27/08* | (2006.01) | |
| *H01L 29/16* | (2006.01) | |
| *H01L 29/04* | (2006.01) | |

(52) U.S. Cl.
CPC ...... *H01L 29/8605* (2013.01); *H01L 27/0802* (2013.01); *H01L 29/04* (2013.01); *H01L 29/16* (2013.01)

(58) Field of Classification Search
CPC .................. H01L 29/8605; H01L 27/0802
See application file for complete search history.

(56) References Cited

U.S. PATENT DOCUMENTS 5,663,860 A * 9/1997 Swonger ............. H01L 27/0251
257/173
8,350,317 B2 * 1/2013 Kocon ................ H01L 21/3065
257/328
8,390,069 B2 * 3/2013 Kusunoki .......... H01L 21/82387
257/360
8,729,929 B2 * 5/2014 Kawamoto ............ H02H 9/025
327/108
8,853,737 B2 * 10/2014 Kusunoki .......... H01L 21/82387
257/140
9,276,094 B2 * 3/2016 Kusunoki .......... H01L 21/82387
2002/0011874 A1 * 1/2002 Takahashi .......... H03K 17/0822
327/50
2010/0118455 A1 * 5/2010 Kusunoki .......... H01L 21/82387
361/56
2012/0248499 A1 * 10/2012 Kusunoki .......... H01L 21/82387
257/140
2015/0054024 A1 * 2/2015 Kusunoki .......... H01L 21/82387
257/139

FOREIGN PATENT DOCUMENTS

JP     2000124343     4/2000

* cited by examiner

*Primary Examiner* — Nicholas J Tobergte
(74) *Attorney, Agent, or Firm* — Adams & Wilks

(57) ABSTRACT

All resistors configuring a resistance voltage dividing circuit are formed by alternately arranging an N-type polycrystalline silicon and a P-type polycrystalline silicon and connecting the same in parallel or in series. The respective resistors themselves cancel a stress received from a resin upon packaging of the resistance voltage dividing circuit since the N-type polycrystalline silicon and the P-type polycrystalline silicon respectively indicate a shift amount in a reverse direction with respect to a stress. There can hence be provided a resistance voltage dividing circuit in which a variation in voltage division ratio at packaging is reduced than before.

3 Claims, 6 Drawing Sheets

PRIOR ART

PRIOR ART

SEMICONDUCTOR DEVICE HAVING RESISTANCE VOLTAGE DIVIDING CIRCUIT

BACKGROUND OF THE INVENTION

Field of the Invention

The present invention relates to a semiconductor device having a resistance voltage dividing circuit.

Background Art

A power supply IC is an analog IC including a constant voltage output IC, a lithium battery protection IC, and the like, and has been required to attain higher precision of an output voltage or a monitoring voltage. The precision thereof is ±1% or ±0.5%, or more severe than that. In order to achieve the high precision, there has been adopted, for example, a method of trimming variations generated in the stage of a wafer manufacturing process (wafer process) by selectively cutting fuses made of polycrystalline silicon by laser or the like in a wafer test process (packaging process) to thereby perform fitting of characteristic values.

An example of a constant voltage output circuit using a resistance voltage dividing circuit is described using FIG. 4. The constant voltage output circuit is composed of a reference voltage generation circuit, an amplifier, a resistance voltage dividing circuit, and an output transistor. The constant voltage output circuit supplies a constant output voltage. The amplifier receives two input voltages from the reference voltage generation circuit and the resistance voltage dividing circuit and operates to equalize the two voltages each other. For example, when a reference voltage is 1.0V and the voltage division ratio of the resistance voltage dividing circuit is 1:1, the voltage output from the constant voltage output circuit becomes 2.0V. Assuming that the required accuracy of the output voltage of the constant voltage output circuit is ±1%, the output voltage should be set to a range of ±1%, i.e., a range from 1.98V to 2.02V. The fitting of the value of the output voltage to high accuracy is performed by the resistance voltage dividing circuit.

The principle of the resistance voltage dividing circuit is illustrated in FIG. 5. Trimming fuses 2 are arranged in parallel with resistors 1 formed of polycrystalline silicon 6 to which a P-type impurity is introduced. When some of the fuses 2 are cut off, the voltage division ratio of the resistance voltage dividing circuit is adjusted and hence the fitting of the output voltage is achieved with high accuracy.

FIG. 6 shows a specific configuration of a resistance voltage dividing circuit. This is a circuit in which resistance elements of ⅛R 7, ¼R 8, ½R 9; 1R 10, 2R 11, 4R 12, Rref (A) 13, and Rref (B) 14 each of which is formed by combining unit resistors all having 1R are connected in series. Here, 1R takes an arbitrary value and does not mean a specific value such as 1 Ohm. The resistance element ⅛R 7 is made by connecting eight unit resistors of 1R in parallel. The resistance element 4R 12 is made by connecting four 1R in series. Others are also similar to the above, and all resistor elements are formed from the same unit resistors. That is, these plural resistance elements respectively have resistance values weighted by power of two. Further, in the resistance voltage dividing circuit, a plurality of fuses 2 is respectively parallel-connected to the resistance elements other than Rref (A) 13 and Rref (B) 14. The fitting of the output voltage is achieved by selectively cutting the fuses and adjusting the voltage division ratio of the resistance voltage dividing circuit.

Even in the chip fabricated with high accuracy in this manner, however, a change in characteristics may occur in a packaging process and in an assembly process to a printed circuit board. In some cases, the specifications of the product may not be satisfied. The cause of the change in characteristics in the packaging process and the board assembly process results in a change in characteristics of the element due to a thermal stress and is considered to be a piezoresistance effect. That is, the resistance value of a polysilicon resistor and the threshold voltage of a transistor, etc., changes by application of a stress to the semiconductor chip through these processes, and by a change in the way of applying the stress thereto according to applied heat, etc.

An invention has been made to prevent such a change in which adjustment of the characteristics of a semiconductor product can be made after assemble to the printed circuit board (refer to, for example, Japanese Patent Application Laid-Open No. 2000-124343). However, the processes described in Japanese Patent Application Laid-Open No. 2000-124343 are complicated, and a simpler method for stabilizing a characteristic value has been desired.

SUMMARY OF THE INVENTION

Packaging of an analog IC into a small-sized package has recently been frequently carried out by request for miniaturization of parts. Thinning of the semiconductor chip, accordingly, has also been advanced. The thinner the semiconductor chip becomes, the more the semiconductor chip distorts when the same stress is applied, and thereby raising a concern that a larger change in characteristics is generated.

The resistance voltage dividing circuit plays a major role in fitting of an output voltage at high precision in the constant voltage output circuit. Uneven stresses are, however, applied to the resistance voltage dividing circuit, and the voltage division ratio thereof becomes, for example, 1:1.02 although the voltage division ratio should be 1:1 ideally so that the precision of the output voltage does not satisfy ±1%.

The present invention aims to provide a resistance voltage dividing circuit capable of reducing a variation in voltage division ratio due to these stresses.

In order to solve the above problems, the present invention provides a semiconductor device having a resistance voltage dividing circuit, the semiconductor device including a plurality of resistance elements connected in series and respectively having resistance values weighted by power of two, and a plurality of short-circuit control elements respectively provided corresponding to the resistance elements and respectively controlling short-circuiting of the resistance elements, and in which the resistance elements are respectively configured by alternately arranging N-type polycrystalline silicon and P-type polycrystalline silicon and connected in series or in parallel.

All resistors configuring a resistance voltage dividing circuit are formed by alternately arranging the N-type polycrystalline silicon and the P-type polycrystalline silicon and connecting the same in parallel or in series.

The respective resistors themselves can thus cancel a stress received from a resin upon packaging of the resistance voltage dividing circuit since the N-type polycrystalline silicon and the P-type polycrystalline silicon respectively indicate a shift amount in a reverse direction with respect to a stress. Hence the variation in the voltage division ratio at the packaging of the resistance voltage dividing circuit can be reduced than before.

DESCRIPTION OF THE EMBODIMENTS

Embodiments of the present invention will hereinafter be described with reference to the accompanying drawings.

Figure 6:
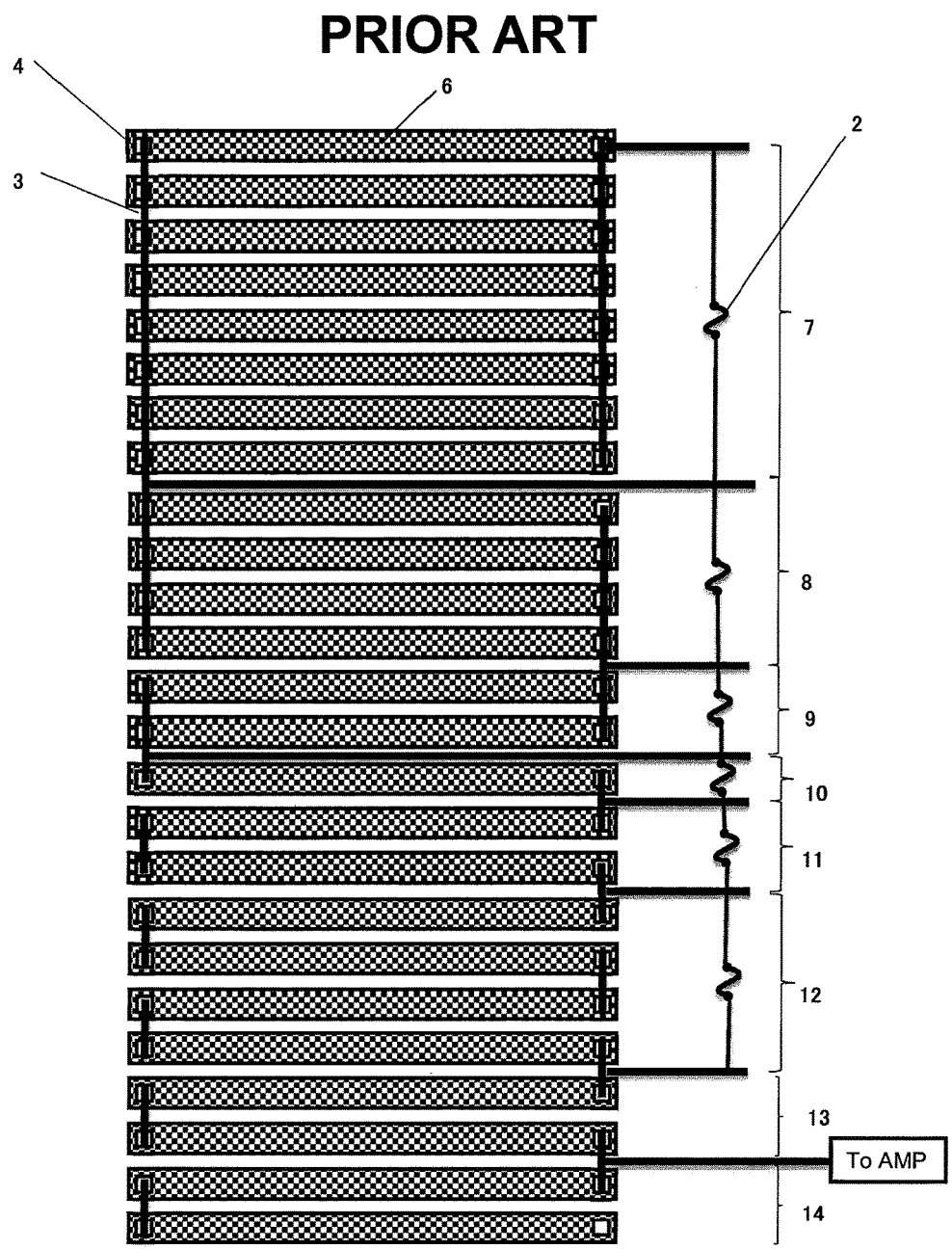
FIG. 6 is a diagram illustrating a related art resistance voltage dividing circuit.

In the present embodiment resistance elements ⅛R 7, ¼R 8, ½R 9, 1R 10, 2R11, 4R12, Rref (A) 13, and Rref (B) 14 configuring a resistance voltage dividing circuit are arranged and connected in series as shown in the related art. Points different between the two reside in that upon configuring the respective resistance elements, all resistors have heretofore been formed by using the polycrystalline silicon 6 with the P-type impurity as described using FIG. 6, whereas in the present embodiment, for example, ⅛R 7 is fabricated by alternately arranging a unit resistor of polycrystalline silicon 5 with an N-type impurity, and a unit resistor of polycrystalline silicon 6 with a P-type impurity and connecting them in parallel by a metal wiring 3 through contacts 4, and 4R 12 is fabricated by alternately arranging polycrystalline silicon 5 with an N-type impurity and polycrystalline silicon 6 with a P-type impurity and connecting them in series by a metal wiring 3 through contacts 4. Other resistors are also fabricated in the same manner.

However, the resistance element 1R 10 can be formed of N-type polycrystalline silicon and P-type polycrystalline silicon by connecting in series N-type short-sized polycrystalline silicon 15 and P-type short-sized polycrystalline silicon 16 each obtained by halving the length of 1R configuring other resistors. By doing this, all the resistance elements can be configured by combining N-type polycrystalline silicon and P-type polycrystalline silicon by the same number. Further, other resistance elements excluding the resistance element 1R 10 are formed of unit resistors of the same shape.

Figure 1:
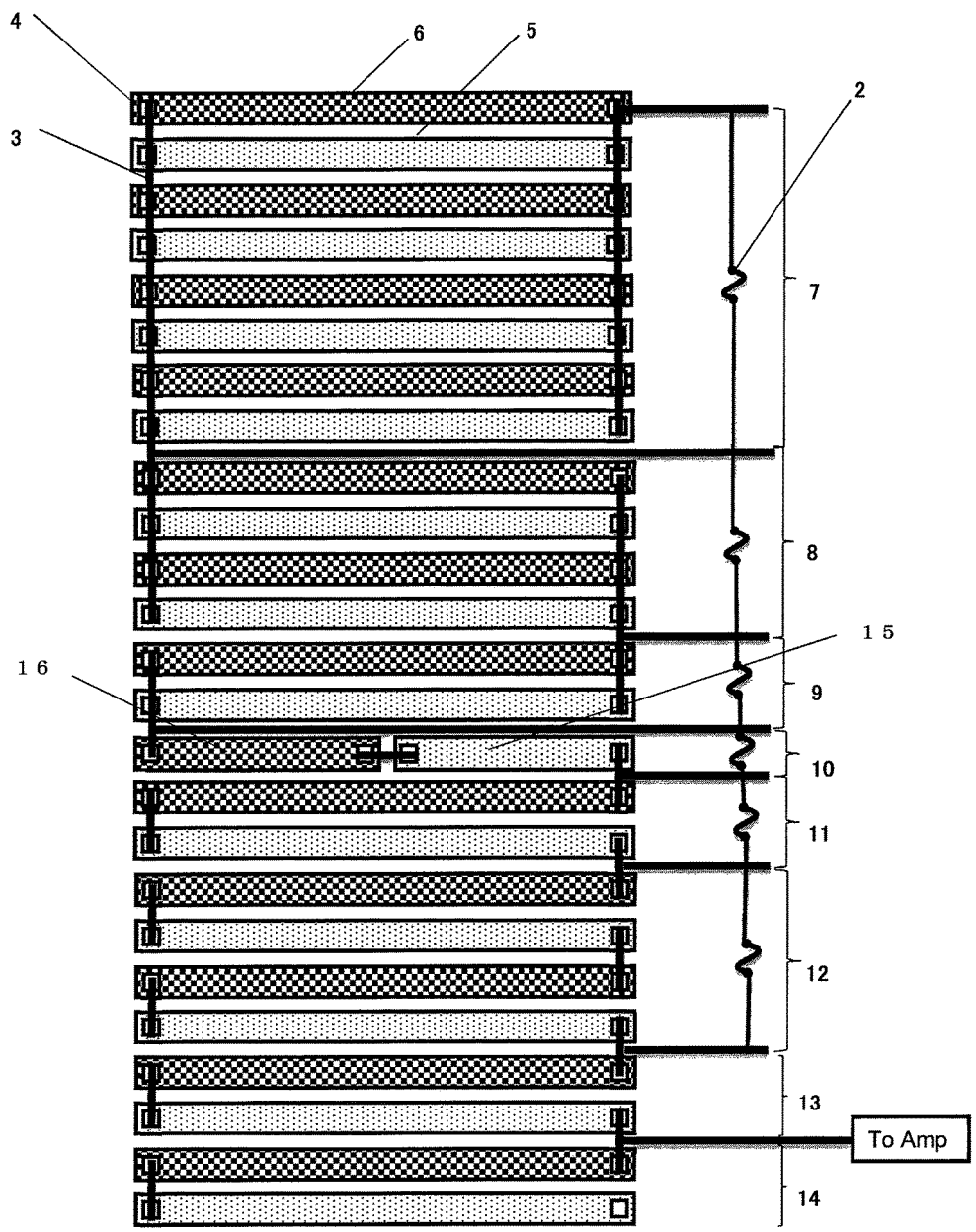
FIG. 1 is a diagram illustrating a resistance voltage dividing circuit of the present invention.
Figure 2:
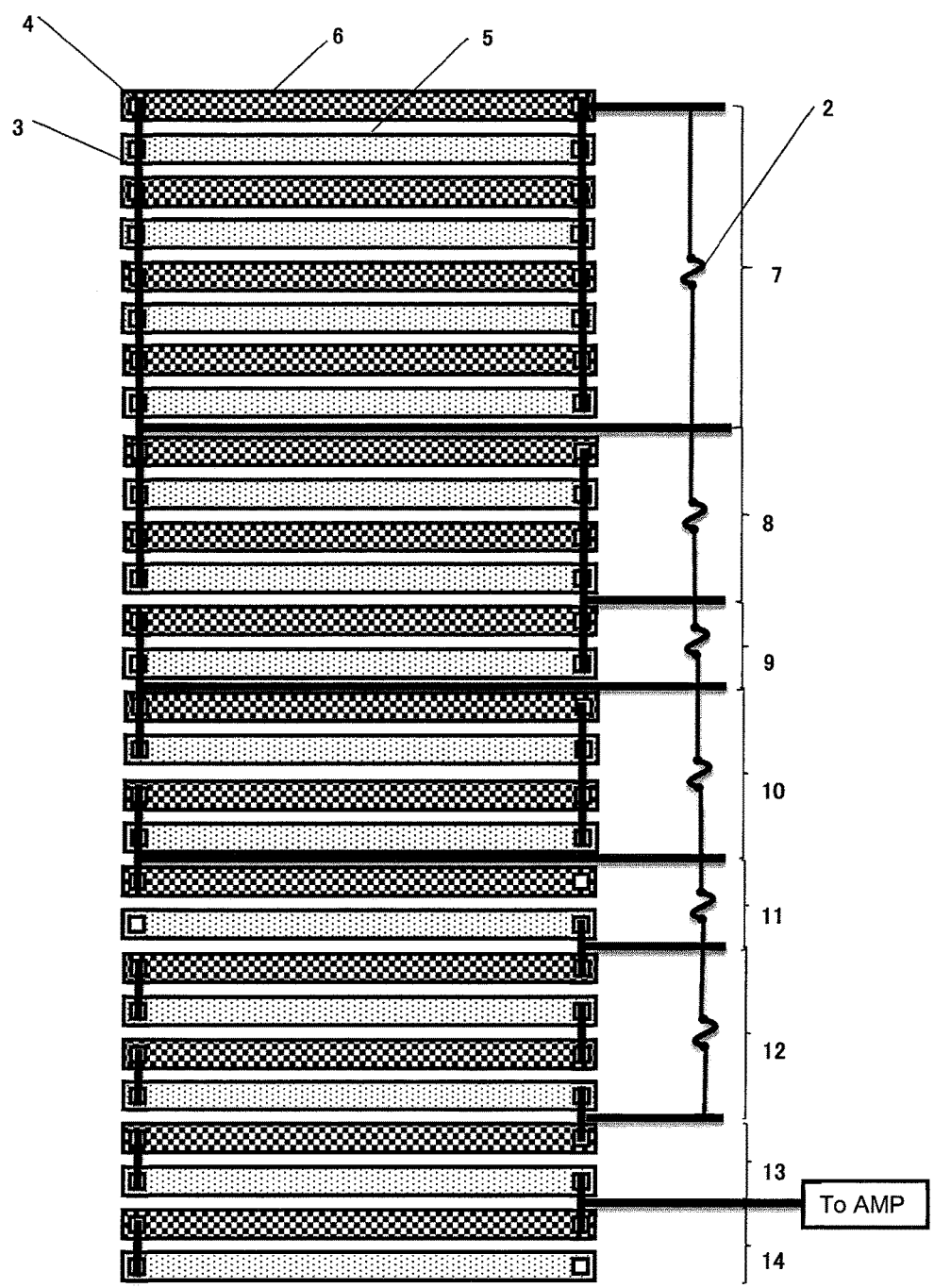
FIG. 2 is a diagram illustrating a resistance voltage dividing circuit of the present invention.

Another configuration method for the resistance element 1R 10 is illustrated in FIG. 2. In FIG. 2, the resistance element 1R10 is configured by connecting in series two ½Rs each obtained by connecting N-type polycrystalline silicon 5 and P-type polycrystalline silicon 6 of the same shape as other unit resistors in parallel one by one. In this configuration method, all the resistance elements can respectively be formed of the unit resistor of the N-type polycrystalline silicon 5 and the unit resistor of the P-type polycrystalline silicon 6 both of which have the same shape. The unit resistor of the N-type polycrystalline silicon 5 and the unit resistor of the P-type polycrystalline silicon 6 preferably have the same resistance value. However, even if they do not have the same resistance value, all the resistance elements are respectively formed of the same number of the unit resistors of N-type polycrystalline silicon 5 and the unit resistors of P-type polycrystalline silicon 6. The ratio between the resistance values can thus be properly set, and hence no problem occurs.

Figure 3:
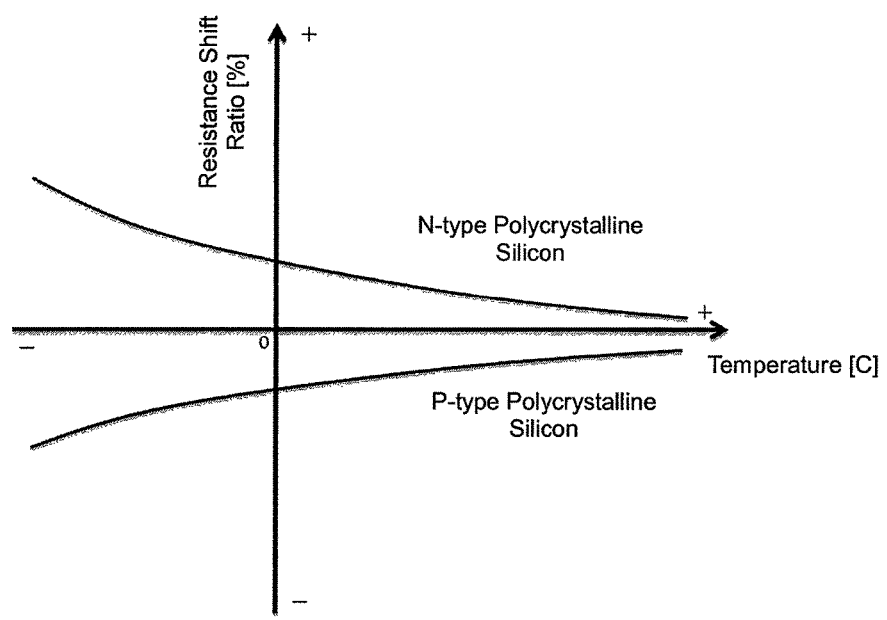
FIG. 3 is a diagram illustrating a resistance value shift ratio before and after packaging of N-type polycrystalline silicon and P-type polycrystalline silicon.
Figure 4:
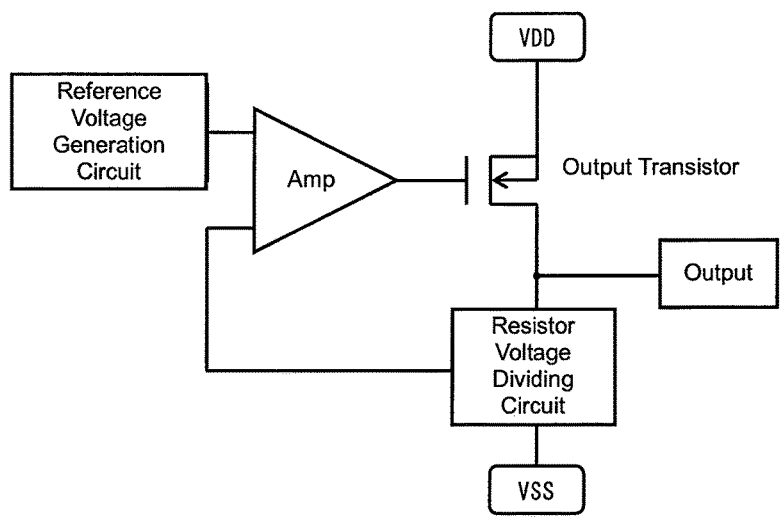
FIG. 4 is a diagram illustrating a constant voltage output circuit.
Figure 5:
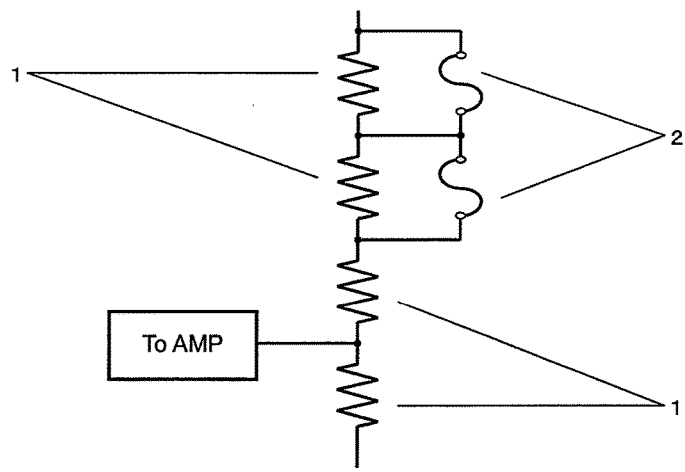
FIG. 5 is a typical diagram illustrating a resistance voltage dividing circuit.

It has been acknowledged that as illustrated in FIG. 3, the N-type polycrystalline silicon 5 and the P-type polycrystalline silicon 6 respectively have a tendency that a shift (shift direction) in the resistance value before and after packaging thereof becomes a reverse direction with respect to a stress received from a resin upon packaging thereof. The present invention utilizes this tendency. Thus, the N-type polycrystalline silicon 5 and the P-type polycrystalline silicon 6 indicate an amount of shift in the reverse direction with respect to the stress. Therefore, by alternately arranging the N-type polycrystalline silicon 5 and the P-type polycrystalline silicon 6 and connecting them in parallel or in series to configure the resistors, the respective resistance elements themselves are capable of cancelling the stress received from the resin upon the packaging. Thus, even if the thinning of a semiconductor chip is advanced due to a request for miniaturization of each part, and a larger stress is applied to the semiconductor chip, it is possible to cancel the stress and maintain the voltage division ratio set with high accuracy by a resistance voltage dividing circuit.

What is claimed is:

1. A semiconductor device having a resistance voltage dividing circuit, comprising:
    a plurality of resistance elements connected in series and respectively having resistance values weighted by power of two; and
    a plurality of short-circuit control elements respectively provided corresponding to the resistance elements and respectively controlling short-circuiting of the resistance elements, the resistance elements being respectively configured by alternately arranging N-type polycrystalline silicon and P-type polycrystalline silicon and connected in series or in parallel.

2. The semiconductor device according to claim 1, wherein the plurality of the resistance elements include a resistance element corresponding to 1 of the resistance values weighted by 0th power of two is configured by connecting in series N-type short-sized polycrystalline silicon having a length of ½ of the length of the N-type polycrystalline silicon configuring other resistance elements, and P-type short-sized polycrystalline silicon having a length of ½ of the length of the P-type polycrystalline silicon configuring other resistance elements.

3. The semiconductor device according to claim 1, wherein the plurality of the resistance elements include a resistance element corresponding to 1 of the resistance values weighted by 0th power of two is configured by connecting N-type polycrystalline silicon configuring other resistance elements and P-type polycrystalline silicon configuring other resistance elements in parallel one by one and connecting the thus-connected one in series by two.

* * * * *